(12) United States Patent
Rudi et al.

(10) Patent No.: US 9,974,194 B2
(45) Date of Patent: May 15, 2018

(54) ELECTRONIC CIRCUIT BOARD UNIT, ELECTRONIC MODULE AND REAR VIEW DEVICE FOR A VEHICLE

(71) Applicant: SMR Patents S.à.r.l., Luxembourg (LU)

(72) Inventors: Artem Rudi, Ludwigsburg (DE); Romeo Wieczorek, Esslingen (DE); Andreas Herrmann, Winnenden-Baach (DE); Nitesh Shah, Bengaluru (IN)

(73) Assignee: SMR Patent S.A.R.L., Luxembourg (LU)

( * ) Notice: Subject to any disclaimer, the term of this patent is extended or adjusted under 35 U.S.C. 154(b) by 0 days. days.

(21) Appl. No.: 15/256,537

(22) Filed: Sep. 3, 2016

(65) Prior Publication Data

US 2017/0071067 A1    Mar. 9, 2017

(30) Foreign Application Priority Data

Sep. 3, 2015    (EP) ..................................... 15183741

(51) Int. Cl.
*H05K 1/14*    (2006.01)
*H05K 5/00*    (2006.01)
(Continued)

(52) U.S. Cl.
CPC ......... *H05K 5/0026* (2013.01); *B60Q 1/2665* (2013.01); *B60R 1/12* (2013.01);
(Continued)

(58) Field of Classification Search
CPC ...... H05K 5/0026; H05K 5/0017; H05K 1/18; H05K 1/141; H05K 1/144;
(Continued)

(56) References Cited

U.S. PATENT DOCUMENTS 3,270,251 A * 8/1966 Evans .................. H01R 9/2458
                                                        361/729
6,036,505 A * 3/2000 Zell ........................ H05K 1/145
                                                        439/74

(Continued)

FOREIGN PATENT DOCUMENTS

WO    2014032976 A1    3/2015

OTHER PUBLICATIONS

European Search Report, Application No. EP15183741 dated Mar. 18, 2016.

*Primary Examiner* — Hung S Bui
(74) *Attorney, Agent, or Firm* — MacMillan, Sobanski & Todd, LLC

(57) ABSTRACT

An electronic circuit board unit for an electronic module installed in a vehicle rear view device. The electronic circuit board unit has a base plate, at least one printed circuit board, and at least one plug connection for an electronic and physical connection between the printed circuit board and the base plate. The electronic circuit board has at least one first receiver for mounting an electronic consumer unit of the electronic module and being attachable or attached to the base plate or to one of the at least one printed circuit board. There is at least one second connector attachable or attached to the base plate or to the at least one printed circuit board for connecting at least one further electronic consumer unit of the electronic module to the driver circuit of the base plate. This configuration provides either n printed circuit boards and n+1 of electronic consumer units, with n being an integer number of 1 and above, or a plurality of printed circuit boards is provided, with each circuit board comprising at least one first receiver and at least one second connector.

14 Claims, 5 Drawing Sheets

(51) Int. Cl.
*B60Q 1/26* (2006.01)
*B60R 1/12* (2006.01)
*H05K 1/18* (2006.01)
*B60R 1/00* (2006.01)

(52) U.S. Cl.
CPC ............. *H05K 1/141* (2013.01); *H05K 1/144* (2013.01); *H05K 1/18* (2013.01); *H05K 5/0017* (2013.01); *B60R 1/00* (2013.01); *H05K 2201/10015* (2013.01); *H05K 2201/10022* (2013.01); *H05K 2201/10106* (2013.01); *H05K 2201/10151* (2013.01); *H05K 2201/10189* (2013.01)

(58) Field of Classification Search
CPC .......... H05K 2201/10015; H05K 2201/10022; B60R 1/12; B60Q 1/2665
USPC .......................................... 361/736
See application file for complete search history.

(56) References Cited

U.S. PATENT DOCUMENTS

| | | | | |
|---|---|---|---|---|
| 6,597,062 | B1* | 7/2003 | Li | G11O 5/063 |
| | | | | 257/686 |
| 7,075,784 | B2* | 7/2006 | Sullivan | G06F 1/16 |
| | | | | 361/679.47 |
| 7,656,671 | B2* | 2/2010 | Liu | G06F 1/185 |
| | | | | 361/735 |
| 8,917,515 | B2* | 12/2014 | Chu | H01R 13/5202 |
| | | | | 361/728 |
| 9,168,871 | B2* | 10/2015 | Soderlind | B60R 1/04 |
| 2002/0043718 | A1 | 4/2002 | Choi | |
| 2005/0046978 | A1 | 3/2005 | Schofield et al. | |
| 2005/0117416 | A1* | 6/2005 | Schnabel | G11C 29/84 |
| | | | | 365/200 |
| 2006/0063400 | A1* | 3/2006 | Tsai | H01R 31/06 |
| | | | | 439/74 |

\* cited by examiner

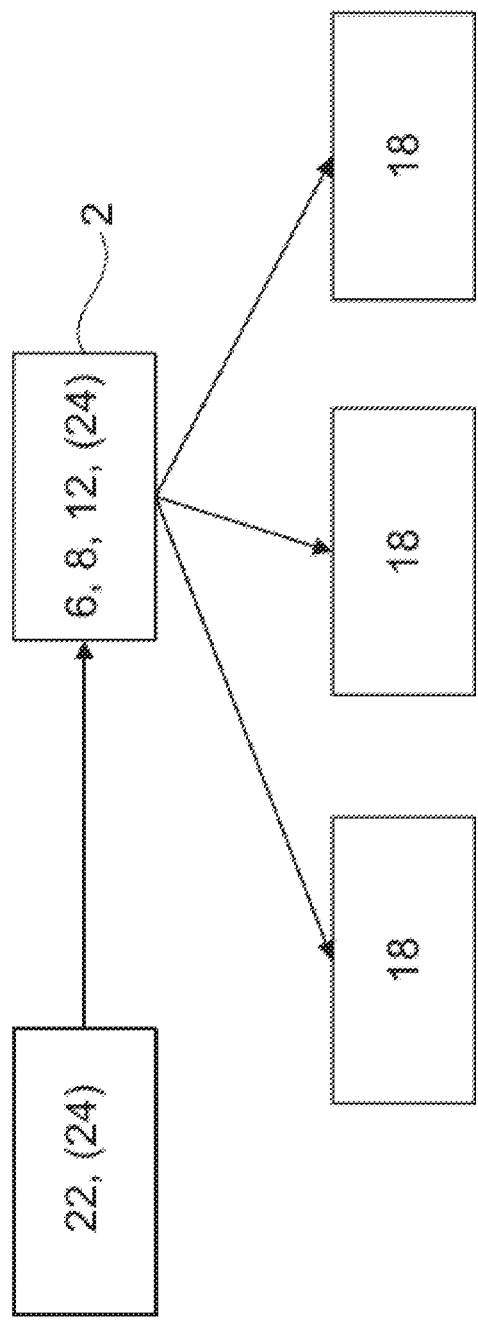

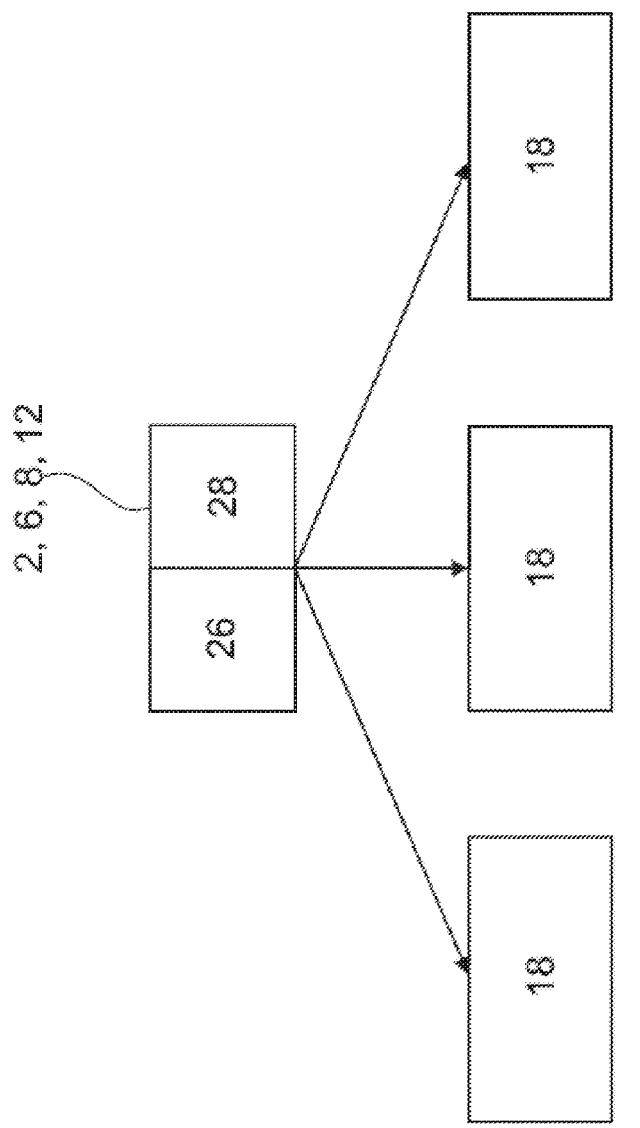

US 9,974,194 B2

ELECTRONIC CIRCUIT BOARD UNIT, ELECTRONIC MODULE AND REAR VIEW DEVICE FOR A VEHICLE

CROSS-REFERENCE TO RELATED APPLICATIONS

This application claims priority from European Patent Application No. 15183741.6, filed Sep. 3, 2015, the disclosure of which is incorporated herein by reference.

BACKGROUND OF THE INVENTION

This invention relates in general to a rear view device for a vehicle. In particular, the invention relates to an electric circuit board unit according to the preamble of claim 1, an electronic module with such an electric circuit board unit and a rear view device for a vehicle with such an electronic circuit board unit and/or with such an electronic module.

Electronic circuit board units for electronic modules of rear view devices are known. As modern rear view devices comprise a plurality of electronic consumer units, which need to be individual selectable, a plurality of circuit boards, each comprising at least one driver circuit, are provided. Further, to seal said plurality of circuit boards comprising driver circuits, the corresponding number of housings and electrical connections need to be provided. Therefore, the rear view device has to provide enough available space.

An electronic circuit board unit is known from DE 10 2013 108 535 comprising a circuit board build by a plurality of carrier elements which are puzzled together. Said electronic circuit board unit is functional working together with a single electronic consumer unit.

US 2005/0046978 A1 refers to a vehicle accessory module and describes an electronic circuit board unit generally for a rear view device.

US 2002/0043718 A1 refers to sockets for module extension and memory system using the same.

WO 2014/032976 A1 refers to a vehicle camera with integrated HF antenna.

It would be desirable to further develop the known electronic circuit board unit such that it allows a space-saving building of a rear view device.

SUMMARY OF THE INVENTION

This invention relates to an electronic circuit board unit for an electronic module installed in a vehicle rear view device. The electronic circuit board unit has an, essentially plane, base plate, comprising at least one driver circuit, with a first connector for directly or indirectly connecting the base plate with at least one power supply. The electronic circuit board unit has at least one, essentially plane, printed circuit board, which is disposable or disposed parallel, angular or cross to the base plate and which is spaced to the base plate, in particular in a manner having no direct contact to the base plate. The electronic circuit board unit has at least one plug connection for an electronic and physical connection between the printed circuit board and the base plate. The electronic circuit board has at least one first receiver for mounting an electronic consumer unit of the electronic module and being attachable or attached to the base plate or to one of the at least one printed circuit board. There is at least one second connector attachable or attached to the base plate or to the at least one printed circuit board for connecting at least one further electronic consumer unit of the electronic module to the driver circuit of the base plate. This configuration provides either n printed circuit boards and n+1 of electronic consumer units, with n being an integer number of 1 and above, or a plurality of printed circuit boards is provided, with each circuit board comprising at least one first receiver and at least one second connector.

In general the base plate and the at least one printed circuit board can be build similar comprising the difference that the base plate comprises the at least one driver circuit. In case the printed circuit board is disposed parallel to the base plate the electronic circuit board unit can be build compact.

By disposing the printed circuit board parallel to the circuit board it is meant that the printed circuit board is disposed in front of or behind the driver and the base plate or on one side of the base plate having a common plane.

Due to the fact that the electronic circuit board unit comprises a base plate and at least one printed circuit board, at least two electronic consumer units of the electronic module can be attached. Therefore, the number of electronic circuit board units needed by the rear view mirror is reduceable and the rear view device can be built space-saving.

The electronic consumer unit can comprise a side turn indicator, a blind spot detection, a logo lamp, a door handle and/or an approach light In general an electronic circuit board unit can be disposed within the vehicle attached to the at least one power supply. In an embodiment of the electronic circuit board unit it is preferred that the base plate comprises an electronic central unit (ECU).

Further, it is advantageous if the at least one plug connection comprises an electrical conducting part reaching connection by clips.

The at least one plug connection can be pin-like, clip-like or puzzle-part-like.

The electronic circuit board unit of one alternative of the invention comprises a plurality of printed circuit boards each circuit board comprising at least one first receiver and at least one second connector. It is preferred that at least one of the plurality of printed circuit boards comprises the first connector.

By comprising a plurality of printed circuit boards all circuit boards unit disposed in the rear view device can be disposed within a single electronic circuit board unit. Therefore, the rear view device can be build space-saving and the electronic rear view is buildable compact.

In a further development of the embodiment of the electronic circuit board unit described before it has been found advantageously that the plurality of printed circuit boards is disposable or disposed parallel to the base plate and is spaced to the base plate and to each other, in particular in a manner having no direct contact to the base plate and to each other. A plurality of plug connections for an electrical and physical connection between the respective printed circuit boards and the base plate has also advantages.

Doing so the electronic circuit board unit can be build in a slim manner and provide enough cooling by air against a danger of overheating.

Furthermore, the invention teaches in another alternative that the electronic circuit board unit comprises a number n of printed circuit boards and a number n+1 of electronic consumer units, wherein preferably n electronic consumer units are connected to the n printed circuit boards and/or one electronic consumer unit is connected to the base plate.

In an further embodiment the electronic circuit board unit comprises at least one electric line connecting at least one electronic consumer unit with at least one second connector.

In general the at least one driver circuit can only comprise one driver circuit. To increase the redundancy it is preferred if the at least one driver circuit comprise a first driver circuit and a second driver circuit, both comprising the same configuration and both connected to each other to operate on redundancy.

Further, it is preferred that the at least one of the at least one printed circuit board and/or the base plate comprises a carrier, circuit paths attached to the carrier and electric parts, as integrated circuits (IC), condensers and/or resistors.

To protect the base plate and the at least one printed circuit board of dirt and humidity an embodiment of an electronic circuit board unit comprises a housing containing the base plate, the at least one printed circuit board and the at least one plug connection in its cavity and by a at least one, in particular a plurality, of recesses to enable an electronic and physical connection between the base plate and the at least one power supply and between the at least one second connector and the at least one electronic consumer and/or by at least one sealing member for sealing the at least one recess in the housing.

The electronic module and rear view device can be build compact if that at least one inner surface of the housing comprise a functional surface being at least a part of the carrier or being the carrier entirely of the at least one printed circuit board and/or of the base plate.

Further, the invention provides an electronic module in form of a light module for a vehicle rear view device, with at least one power supply, with at least one electronic consumer unit and with at least one electronic circuit board unit according to the invention. It has been found out as advantage, if the at least one electronic consumer unit comprises a side turn indicator (STI), a blind spot detection (BSD), a logo lamp, a door handle and/or an approach light and/or by an external electronic central unit (ECU) or by that the electronic circuit board comprises an electronic central unit (ECU).

Finally, the invention provides a rear view device for a vehicle comprising an electronic module of the invention and/or comprising an electronic circuit board unit of the invention. The rear view device further comprises an outside or inside rear view mirror and/or a camera.

The electronic circuit board unit, the electronic module and the rear view device are advantages in several aspects:

By comprising a base plate and at least one printed circuit board all electronic circuit board units can be combined within one single electronic circuit board unit. Therefore the rear view device can be built space-saving.

Various aspects of this invention will become apparent to those skilled in the art from the following detailed description of the preferred embodiment, when read in light of the accompanying drawings.

BRIEF DESCRIPTION OF THE DRAWINGS

FIG. 4 is a schematic diagram of a first control possibility of the electronic circuit board unit according to FIG. 2.

FIG. 5 is a schematic diagram of a second control possibility of the electronic circuit board unit according to FIG. 2.

DETAILED DESCRIPTION OF THE PREFERRED EMBODIMENT

Figure 1:
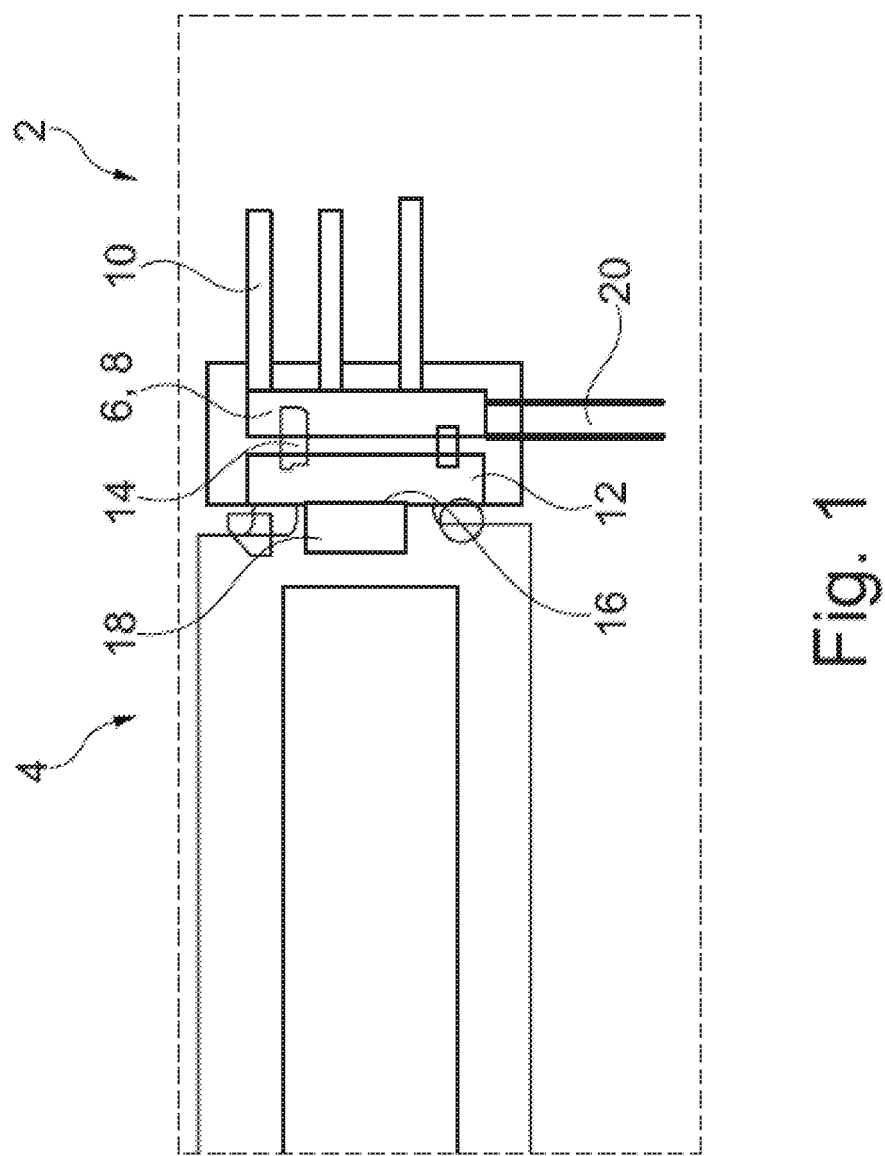
FIG. 1 is a schematic side view on a first embodiment of the electronic circuit board unit.

Referring now to the drawings, there is illustrated in FIG. 1 *a*

Figure 2:
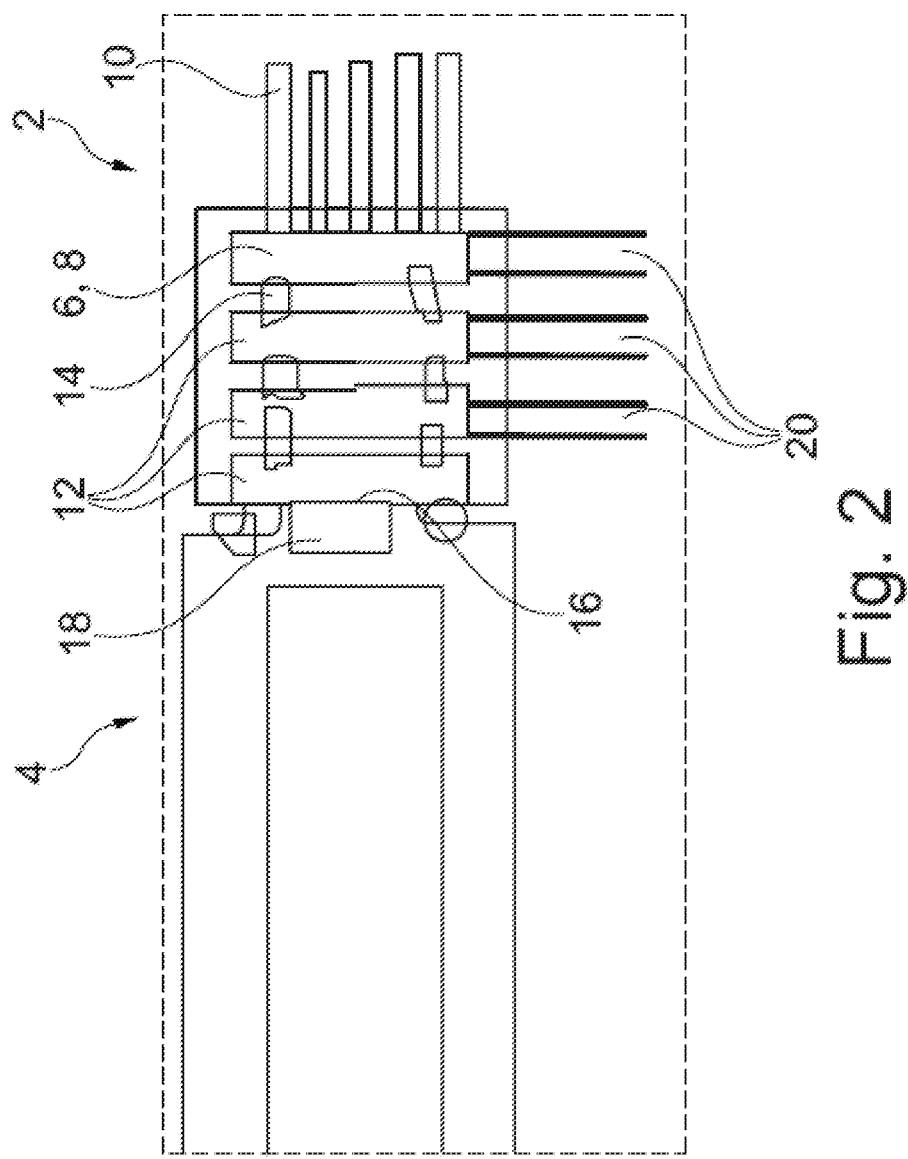
FIG. 2 is a schematic side view on a second embodiment of the electronic circuit board unit.

FIGS. 1 and 2 show embodiments of electronic circuit board units 2 for electronic modules of rear view devices. The respective electronic circuit board unit 2 comprise an essentially plane base plate 6 comprising a driver circuit 8. Further, the electronic circuit board unit 2 comprises a first connector 10 for connecting the base plate 6 with at least one power supply (not shown in the Figures). Furthermore, the electronic circuit board unit 2 comprises one (FIG. 1) or more, in particular three (FIG. 2), printed circuit boards 12 which are disposed parallel and spaced to the base plate 6. For electronically and physically connecting between the printed circuit boards 12 and the base plate 6 the electronic circuit board unit 2 comprises plug connections 14.

In the embodiments shown in FIGS. 1 and 2 one of the printed circuit boards 12 comprises a first receiver 16 for mounting an electronic consumer unit 18 of the electronic module 4. The electronic consumer unit 18 shown in FIGS. 1 and 2 comprises a light source, i. e. a light emitting diode (LED).

The electronic circuit board unit 2 further comprises one second connector (FIG. 1) 20 attached to the base plate 6 and a plurality of second connectors 20 (FIG. 3) attached as well to the base plate 6 and to at least two printed circuit boards 12. The second connectors 20 are for connecting further electronic consumer units of the electronic module 14 to the electronic circuit board unit 2.

The base plate 6 comprising the driver circuit 8 controls the printed circuit boards 12, in particular directing the power coming from the power supply to the respective electronic consumer units.

FIG. 1 shows a first embodiment of the electronic circuit board unit 2 with one base plate 6 comprising one driver circuit 8 and one printed circuit board 2. Base plate 6 and printed circuit board 12 are connected with each other by the plug connection 14. By using the plug connection 14 base plate 6 and printed circuit board 12 are disposed parallel and spaced to each other. On the one printed circuit board 12 first receiver 16 is disposed and an electronic consumer unit 18 is mounted on said first receiver 16. Wire the second connector 20 connected to the base plate 6 a further electronic consumer unit is connected to the base plate 6 with its driver circuit 8. Therefore with the embodiment of a driver circuit board unit 2 shown in FIG. 1 two electronic consumer unit 18 can be managed.

FIG. 2 shows a second embodiment of the electronic circuit board unit 12 comprising one base plate 6 and three printed circuit boards 12. The base plate 6 as well as the printed circuit boards 12 are connected to each other by plug connections 14 which allow to dispose the printed circuit boards 12 and the base plate 6 parallel and spaced to each other.

Further, the base plate 6 and two of the three printed circuit boards 12 comprise the second connectors 20 to be connected to the further electronic consumer units. The third printed circuit board 12 comprises the first receiver 16 on which the electronic consumer unit 18 is connected. Said printed circuit board 12 does not provide second connector 20.

Figure 3:
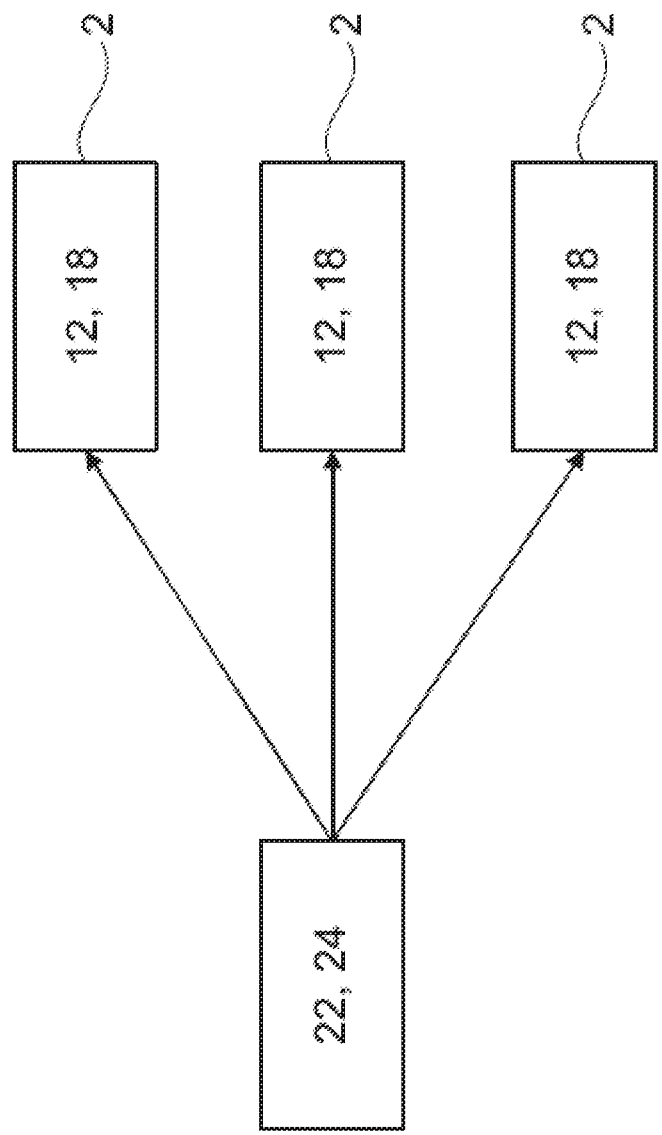
FIG. 3 is a schematic diagram of a control possibility of the electronic circuit board unit according to the state of the art.

FIG. 3 shows an existing scenario of known electronic circuit board units 2. As can be derived from FIG. 3 a power supply 22 connected to an electronic circuit unit 24 is connected to a plurality of electronic circuit board units 2.

Each of the known electronic circuit board units 2 comprise a separate printed circuit board 12 connected to a single electronic consumer 18. The electronic consumer unit 18 can comprise a side turn indicator, a blind spot detection, a logo lamp, a door handle and/or an approach light.

FIG. 4 shows a schematic diagram of the embodiment of the electronic circuit board unit 2 according to FIG. 2. The power supply 22 is connected to a single electronic circuit board unit 2 comprising a base plate 6 with the driver circuit 8 and a plurality of printed circuit boards 12. Said single electronic circuit board unit 2 is connected to a plurality of electronic consumer units 18. Further, the electronic circuit board unit 2 according to FIG. 4 can comprise the electronic central unit 24 or the electronic central unit 24 can be comprised by the power supply 22.

FIG. 5 shows an embodiment similar to FIG. 4 having one single circuit board unit 2 comprising a base plate 6 with a driver unit 8 and a plurality of printed circuit boards 12. Said electronic circuit board unit 2 is connected to a plurality of electronic consumer units 18. To increase redundancy the driver circuit 8 comprises a first driver circuit 26 and the second driver circuit 28.

The principle and mode of operation of this invention have been explained and illustrated in its preferred embodiment. However, it must be understood that this invention may be practiced otherwise than as specifically explained and illustrated without departing from its spirit or scope.

What is claimed is:

1. An electronic circuit board unit for an electronic module installed in a vehicle rear view device,
   with an, essentially plane, base plate, comprising at least one driver circuit, with a first connector for directly or indirectly connecting the base plate with at least one power supply,
   with at least one, essentially plane, printed circuit board, which is disposable or disposed parallel, angular or cross to the base plate and which is spaced to the base plate, in particular in a manner having no direct contact to the base plate,
   with at least one plug connection for electronically and physically connecting between the printed circuit board and the base plate, and
   with at least one first receiver for mounting an electronic consumer unit of the electronic module and being attachable or attached to the base plate or to one of the at least one printed circuit board,
   wherein at least one second connector attachable or attached to the base plate or to the at least one printed circuit board for connecting at least one further electronic consumer unit of the electronic module to the driver circuit of the base plate, such that
   either n printed circuit boards and n+1 of electronic consumer units are comprised, with n being an integer number of 1 and above, or
   a plurality of printed circuit boards is provided, with each circuit board comprising at least one first receiver and at least one second connector, and
   wherein the electronic module is in the form a light module for a vehicle rear view device with the at least one power supply and the at least one electronic consumer unit.

2. The electronic circuit board unit according to claim 1, wherein the base plate comprises an electronic central unit (ECU).

3. The electronic circuit board unit according to claim 1, wherein the at least one plug connection comprises an electrical conducting part reaching connection by clipping.

4. The electronic circuit board unit according to claim 1, wherein at least one of the at least one printed circuit board comprises a puzzle printed circuit board.

5. The electronic circuit board unit according to claim 1, wherein a plurality of printed circuit boards, with at least one of the plurality of printed circuit boards comprises the first connector.

6. The electronic circuit board unit according to claim 1, wherein
   the plurality of printed circuit boards is disposable or disposed parallel to the base plate and is spaced to the base plate and to each other, in particular in a manner having no direct contact to the base plate and to each other, and
   there is a plurality of plug connections for an electronic and physical connection between the respective printed circuit boards and the base plate.

7. The electronic circuit board unit according to claim 1, wherein n electronic consumer units are connected to the n printed circuit boards and one electronic consumer unit is connected to the base plate.

8. The electronic circuit board unit according to claim 1, wherein at least one electric line connecting at least one electronic consumer unit with at least one second connector.

9. The electronic circuit board unit according to claim 1, wherein the at least one driver circuit comprise a first driver circuit and a second driver circuit, both comprising the same configuration and both connected to each other to operate on redundancy.

10. The electronic circuit board unit according to claim 1, wherein at least one of the at least one printed circuit board and/or the base plate comprises a carrier, circuit paths attached to the carrier and electric parts, as integrated circuits (IC), condensers and/or resistors.

11. The electronic circuit board unit according to claim 1, wherein
    a housing containing the base plate, the at least one printed circuit board and the at least one plug connection in its cavity, and
    at least one, in particular a plurality, of recesses to enable an electronic and physical connection between base plate and the at least one power supply and between the at least one second connector and the at least one electronic consumer.

12. The electronic circuit board unit according to claim 11, wherein
    at least one of the at least one printed circuit board and/or the base plate comprises a carrier, circuit paths attached to the carrier and electric parts, as integrated circuits (IC), condensers and/or resistors; and
    at least one inner surface of the housing comprise a functional surface being at least a part of the carrier or being the carrier entirety of the at least one printed circuit board and/or of the base plate.

13. The electronic circuit board unit according to claim 1, wherein the at least one electronic consumer unit of the electronic module comprises a side turn indicator (STI), a blind spot detection (BSD), a logo lamp, a door handle and/or an approach light.

14. A rear view device for a vehicle, comprising the electronic module and/or the electronic circuit board unit according to claim 1, and comprising an outside or inside rear view mirror and/or a camera.

* * * * *